United States Patent
Huang et al.

(10) Patent No.: US 9,558,845 B2
(45) Date of Patent: Jan. 31, 2017

(54) SAMPLING NETWORK AND CLOCKING SCHEME FOR A SWITCHED-CAPACITOR INTEGRATOR

(71) Applicant: QUALCOMM Incorporated, San Diego, CA (US)

(72) Inventors: Wenchang Huang, San Diego, CA (US); Ramkumar Sivakumar, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 83 days.

(21) Appl. No.: 14/700,696

(22) Filed: Apr. 30, 2015

(65) Prior Publication Data

US 2016/0284420 A1    Sep. 29, 2016

Related U.S. Application Data

(60) Provisional application No. 62/138,200, filed on Mar. 25, 2015.

(51) Int. Cl.
| | |
|---|---|
| *G06F 7/64* | (2006.01) |
| *G06G 7/18* | (2006.01) |
| *G06G 7/19* | (2006.01) |
| *G11C 27/02* | (2006.01) |
| *H03H 19/00* | (2006.01) |

(52) U.S. Cl.
CPC .......... *G11C 27/026* (2013.01); *H03H 19/004* (2013.01)

(58) Field of Classification Search
USPC .................................................. 327/337, 554
See application file for complete search history.

(56) References Cited

U.S. PATENT DOCUMENTS

| | | | |
|---|---|---|---|
| 5,982,315 A | 11/1999 | Bazarjani et al. | |
| 6,137,321 A | 10/2000 | Bazarjani | |
| 6,388,500 B1 * | 5/2002 | Lee ......................... | G06G 7/06 |
| | | | 327/337 |
| 6,573,785 B1 * | 6/2003 | Callicotte ........... | H03F 3/45475 |
| | | | 327/554 |
| 6,617,887 B2 * | 9/2003 | Nix ..................... | H03F 3/45753 |
| | | | 327/337 |
| 6,617,908 B1 * | 9/2003 | Thomsen ............... | H03F 3/005 |
| | | | 327/337 |
| 7,038,532 B1 * | 5/2006 | Bocko .................... | G06G 7/186 |
| | | | 327/337 |

(Continued)

OTHER PUBLICATIONS

International Search Report and Written Opinion—PCT/US2016/021917—ISA/EPO—Jun. 6, 2016.

*Primary Examiner* — Adam Houston
(74) *Attorney, Agent, or Firm* — Patterson & Sheridan, L.L.P.

(57) ABSTRACT

Certain aspects of the present disclosure generally relate to a sampling network of a switched-capacitor integrator and a clocking scheme associated therewith, which may be used in an analog-to-digital converter (ADC), for example. The integrator generally includes five sets of switches which allow for a decreased switching frequency (e.g., halved) at an input stage of the integrator compared to conventional double sampling networks. As a result, the input impedance of the integrator may be increased (e.g., doubled), resulting in lower power consumption and reduced strain on driving circuitry.

30 Claims, 7 Drawing Sheets

(56) References Cited

U.S. PATENT DOCUMENTS

| | | | |
|---|---|---|---|
| 7,385,427 B2* | 6/2008 | Lim | G11C 27/02 327/92 |
| 7,397,287 B2* | 7/2008 | Makihara | G11C 27/026 327/91 |
| 7,633,423 B2* | 12/2009 | Cho | H03F 1/0205 341/155 |
| 7,932,752 B2* | 4/2011 | Ohba | H04N 5/378 327/337 |
| 8,009,071 B2* | 8/2011 | Sundblad | H03F 3/45475 327/337 |
| 8,026,760 B1* | 9/2011 | Prasad | H03F 3/005 330/311 |
| 8,106,809 B2 | 1/2012 | Groenewold | |
| 8,410,846 B2* | 4/2013 | Zare-Hoseini | H03G 5/00 327/337 |
| 8,456,337 B1* | 6/2013 | Krishna | H03F 3/45475 327/280 |
| 8,497,746 B2* | 7/2013 | Visconti | H03H 11/126 327/337 |
| 8,624,765 B2 | 1/2014 | Watanabe | |
| 8,742,964 B2* | 6/2014 | Kleks | H03M 3/494 327/100 |
| 8,803,559 B2* | 8/2014 | Toyotaka | H03F 3/005 327/337 |
| 8,836,416 B2* | 9/2014 | Fan | H03K 5/249 327/552 |
| 8,963,630 B2* | 2/2015 | Ceballos | H03F 3/45475 327/337 |
| 9,000,809 B2 | 4/2015 | Bogner et al. | |
| 2002/0149508 A1* | 10/2002 | Hamashita | H03M 3/496 341/172 |
| 2003/0210166 A1 | 11/2003 | Liu et al. | |
| 2003/0234683 A1* | 12/2003 | Lou | H03H 11/0422 327/554 |
| 2004/0070439 A1* | 4/2004 | Sarraj | H03K 17/16 327/337 |
| 2006/0114049 A1* | 6/2006 | Josefsson | H03H 19/004 327/337 |
| 2006/0119411 A1* | 6/2006 | Wei | H03H 19/004 327/337 |
| 2006/0119412 A1* | 6/2006 | Wei | H03F 3/005 327/337 |
| 2009/0146735 A1* | 6/2009 | Jeong | H03F 3/005 327/554 |
| 2011/0298520 A1* | 12/2011 | Masson | H04B 1/71637 327/337 |
| 2012/0133417 A1* | 5/2012 | Darzy | G06G 7/161 327/337 |
| 2012/0249235 A1* | 10/2012 | Zare-Hoseini | H03G 1/0088 330/86 |
| 2013/0106505 A1 | 5/2013 | Sun et al. | |
| 2014/0313795 A1 | 10/2014 | Mi et al. | |
| 2014/0375374 A1* | 12/2014 | Nervegna | G01N 27/26 327/337 |
| 2015/0003117 A1 | 1/2015 | Ferrazza et al. | |
| 2016/0048707 A1* | 2/2016 | Alladi | G06G 7/186 341/143 |
| 2016/0149586 A1* | 5/2016 | Roh | H03M 3/39 341/143 |

* cited by examiner

(First Sampling Phase)
FIG. 8A

(First Integration Phase)
FIG. 8B (Second Sampling Phase)
FIG. 8C (Second Integration Phase)
FIG. 8D

FIG. 9

SAMPLING NETWORK AND CLOCKING SCHEME FOR A SWITCHED-CAPACITOR INTEGRATOR

CROSS-REFERENCE TO RELATED APPLICATION

This application claims benefit of U.S. Provisional Patent Application Ser. No. 62/138,200, filed Mar. 25, 2015 and entitled "DOUBLE SAMPLING NETWORK AND CLOCKING SCHEME," which is herein incorporated by reference in its entirety.

TECHNICAL FIELD

Certain aspects of the present disclosure generally relate to electronic circuits and, more particularly, to a sampling network and clocking scheme for a switched-capacitor integrator.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to a double-sampling network and its associated clocking scheme, which may be used in a switched-capacitor integrator.

Certain aspects of the present disclosure provide a switched-capacitor integrator. The switched-capacitor integrator generally includes an amplifier having first and second output nodes and first and second input nodes; a first integration capacitor coupled between the first output node and the first input node of the amplifier; a second integration capacitor coupled between the second output node and the second input node of the amplifier; first and second sampling capacitors, each having a first terminal and a second terminal; a first set of switches configured, during a first sampling phase of the integrator, to connect first and second voltages of a differential signal with the first terminals of the first and second sampling capacitors, respectively; a second set of switches configured to connect the second terminals of the first and second sampling capacitors with a reference potential during the first sampling phase of the integrator, wherein a switching frequency of the first set of switches is less than a switching frequency of the second set of switches; and a third set of switches configured, during a first integration phase of the integrator, to connect the second terminals of the first and second sampling capacitors with the first and second input nodes of the amplifier, respectively.

In certain aspects, the switching frequency of the first set of switches is half the switching frequency of the second set of switches.

In certain aspects, a switching frequency of the third set of switches is half the switching frequency of the second set of switches.

In certain aspects, the integrator may further include a fourth set of switches configured, during the first integration phase of the integrator, to connect the first and second voltages of the differential signal with the first terminals of the second and first sampling capacitors, respectively. In certain aspects, a switching frequency of the fourth set of switches is half the switching frequency of the second set of switches. In certain aspects, the third set of switches and the fourth set of switches are open during the first sampling phase. In certain aspects, during a second sampling phase of the integrator, the fourth set of switches are configured to connect the first and second voltages of the differential signal with the first terminals of the second and first sampling capacitors, respectively; and the second set of switches are configured to connect the second terminals of the first and second sampling capacitors with the reference potential. In certain aspects, the first set of switches and the third set of switches are open during the second sampling phase. In certain aspects, the integrator may further include a fifth set of switches. During a second integration phase of the integrator, the first set of switches may be configured to connect the first and second voltages of the differential signal with the first terminals of the first and second sampling capacitors, respectively; and the fifth set of switches may be configured to connect the second terminals of the first and second sampling capacitors with the second and first input nodes of the amplifier, respectively.

In certain aspects, a switching frequency of the fifth set of switches is half the switching frequency of the second set of switches. In certain aspects, the second set of switches, the third set of switches, and the fourth set of switches are open during the second integration phase. In certain aspects, the first set of switches, the third set of switches, and the fifth set of switches are open during the second sampling phase. In certain aspects, the first set of switches, the second set of switches, and the fifth set of switches are open during the first integration phase. In certain aspects, the third set of switches, the fourth set of switches, and the fifth set of switches are open during the first sampling phase. In certain aspects, the first integration phase follows the first sampling phase, the second sampling phase follows the first integration phase, and the second integration phase follows the second sampling phase.

In certain aspects, the second set of switches are open during the first integration phase.

In certain aspects, the third set of switches are open during the first sampling phase.

Certain aspects of the present disclosure provide a method for processing a differential signal with a switched-capacitor integrator. The method generally includes, during a first sampling phase of the integrator, sampling first and second voltages of a differential signal via first and second sampling capacitors, each having a first terminal and a second terminal. In certain aspects, the sampling comprises connecting, via a first set of switches, the first and second voltages of the differential signal with the first terminals of the first and second sampling capacitors, respectively, and connecting, via a second set of switches, the second terminals of the first and second sampling capacitors with a reference potential. In certain aspects, a switching frequency of the first set of switches is less than a switching frequency of the second set of switches.

In certain aspects, the method further includes, during a first integration phase of the integrator, integrating the sampled first and second voltages of the differential signal, via an amplifier having first and second input nodes and first and second output nodes. In certain aspects, a first integration capacitor may be coupled between the first output node and the first input node of the amplifier, and a second integration capacitor may be coupled between the second output node and the second input node of the amplifier. In certain aspects, the integrating comprises connecting, via a third set of switches, the second terminals of the first and second sampling capacitors with the first and second input nodes of the amplifier, respectively.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
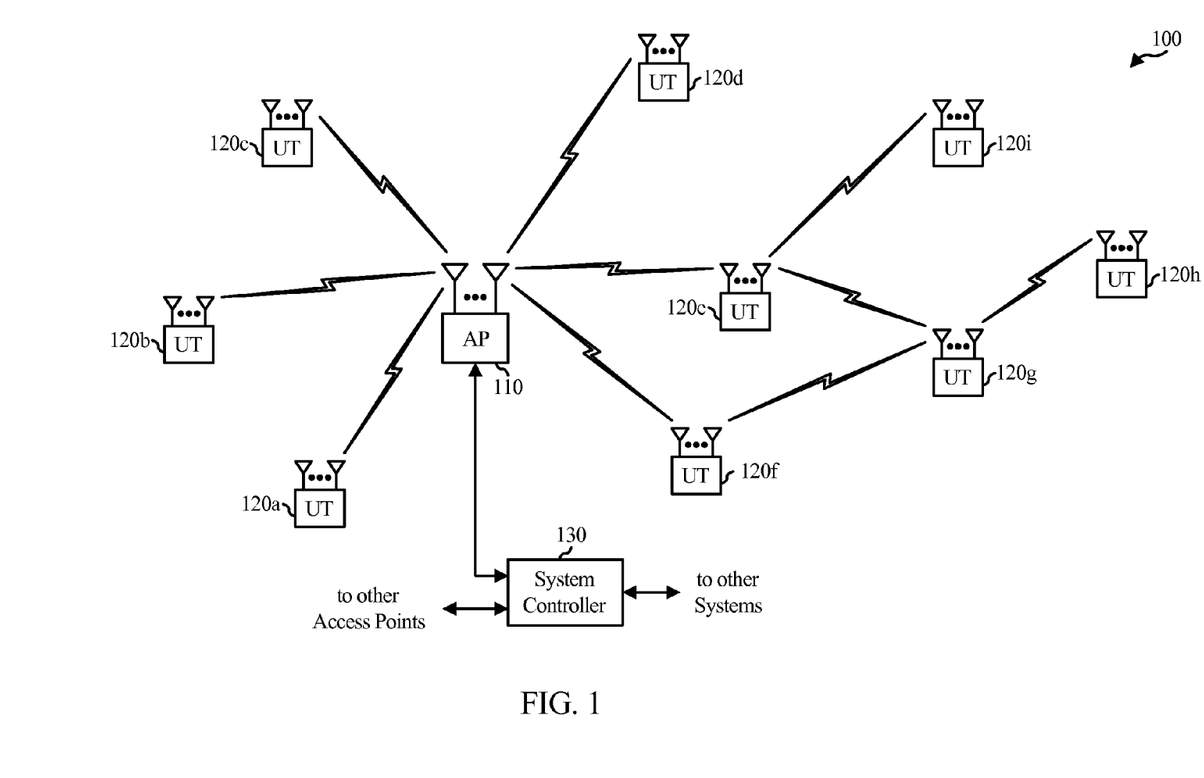
FIG. 1 is a diagram of an example wireless communications network in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
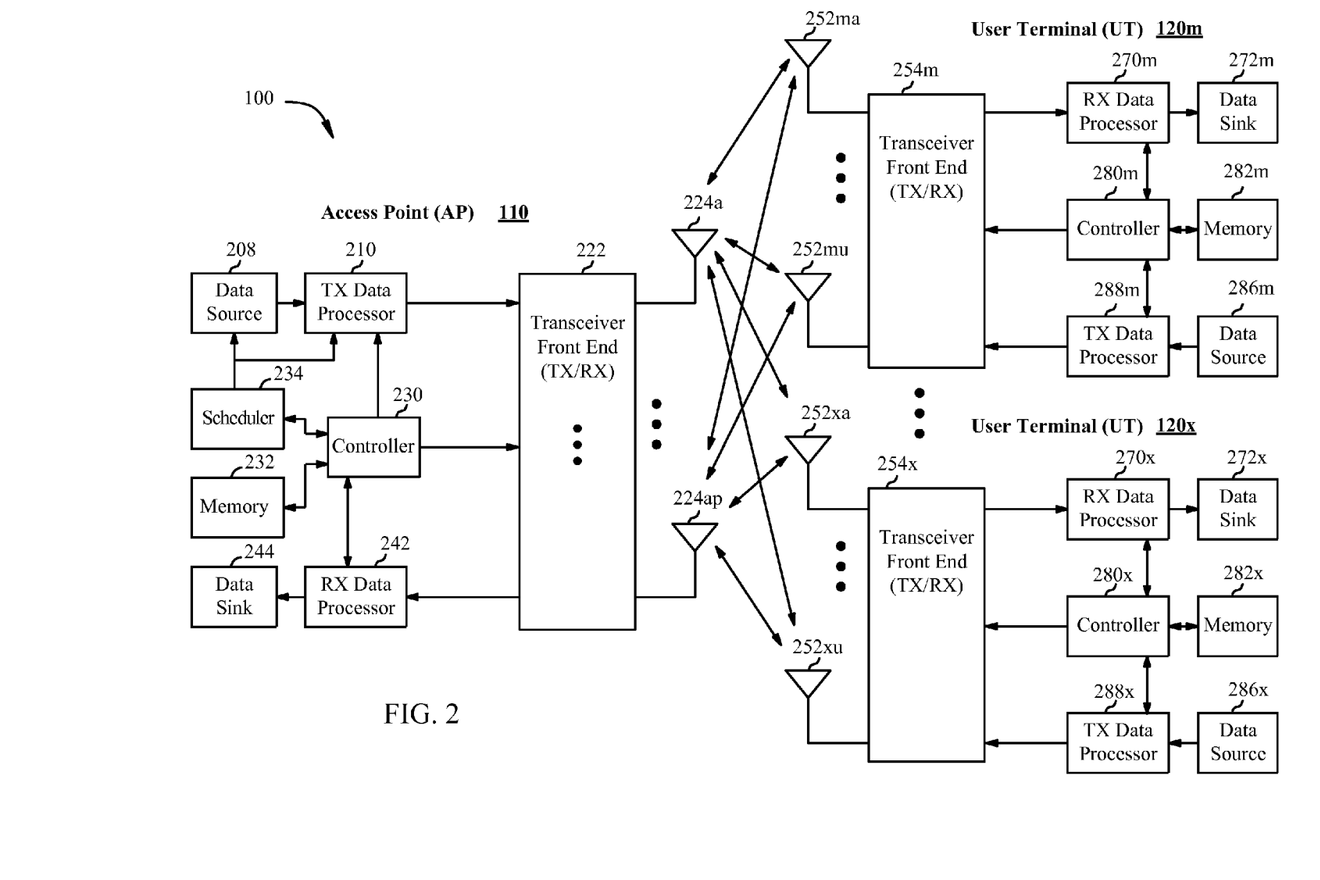
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
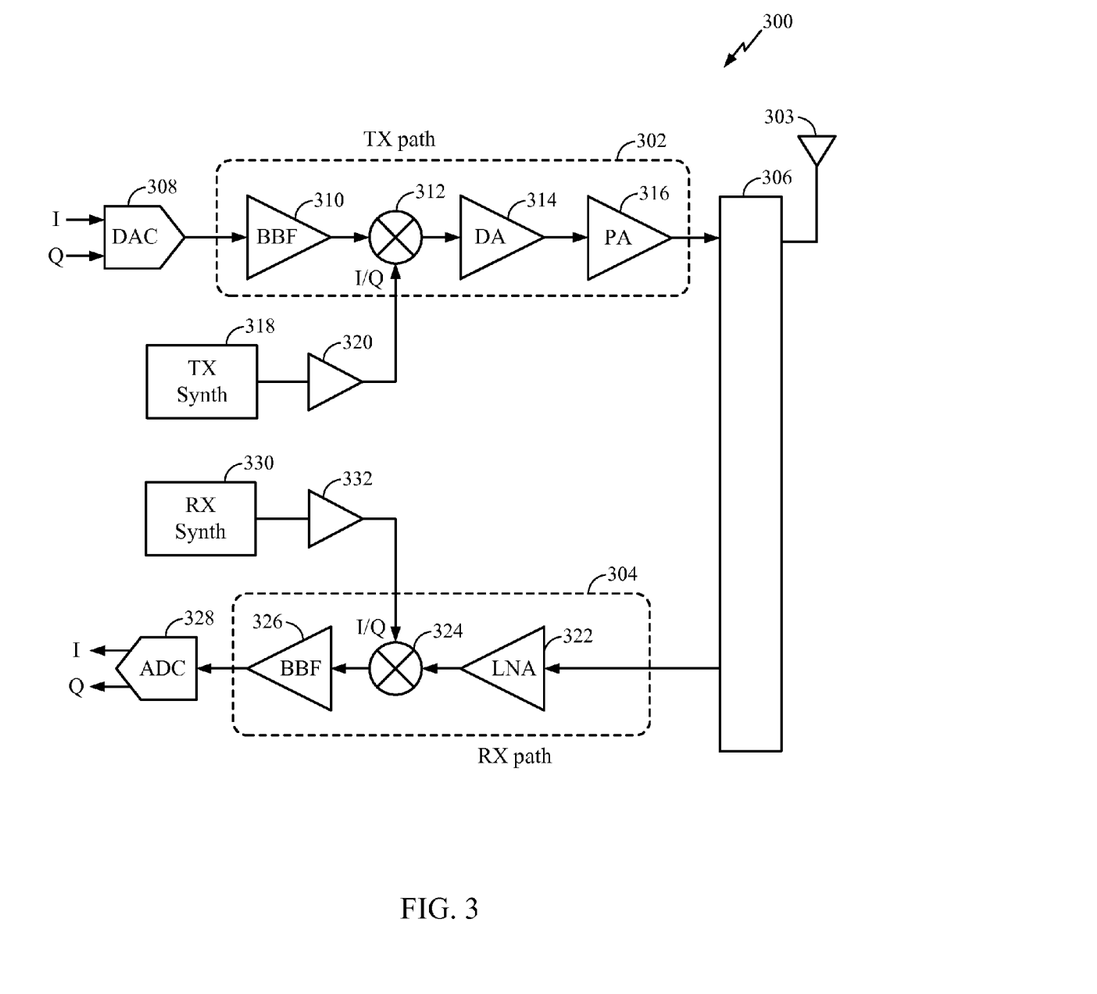
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). Known as heterodyning, this frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

Example Sampling Networks for a Switched-Capacitor Integrator

An analog-to-digital converter (ADC) (e.g., ADC 328 or a delta-sigma (ΔΣ) ADC) may be implemented with a switched-capacitor integrator having a particular sampling network. In the input or digital-to-analog converter (DAC) sampling network of an ADC design, double sampling may be used to improve noise performance. Double sampling is a technique used to double the effective sampling rate of a switched-capacitor (SC) integrator, without using a faster amplifier. However, double sampling may not be power efficient due to higher charge loss caused by the double sampling network switching every clock cycle. Therefore, what is needed are apparatus and techniques for implementing double sampling networks with greater power efficiency.

Aspects of the present disclosure provide a different clocking scheme for a double sampling network in an effort to increase power efficiency. For example, instead of opening and closing two different sets of input sampling switches every clock cycle (e.g., connecting the input to a sampling capacitor via a set of switches), the two different sets of input sampling switches may be switched every two clock cycles. This clocking scheme may reduce the switching power of the integrator's sampling network by half, thereby reducing the charge loss, and has the benefit of improved distortion performance due to the decreased input switching activity.

Figure 4:
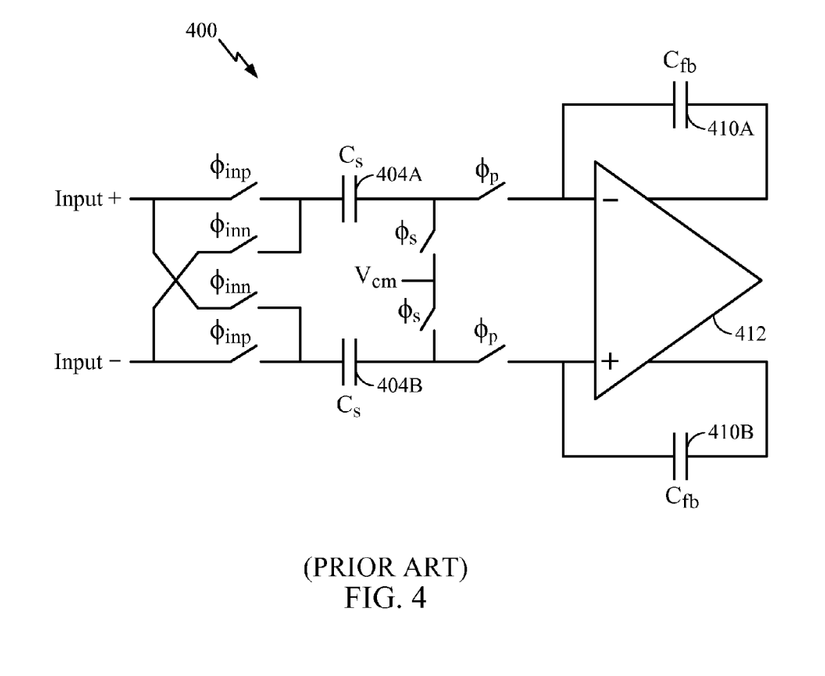
FIGS. 4 and 5 are circuit and timing diagrams for a switched-capacitor integrator, in accordance with the prior art.
Figure 5:
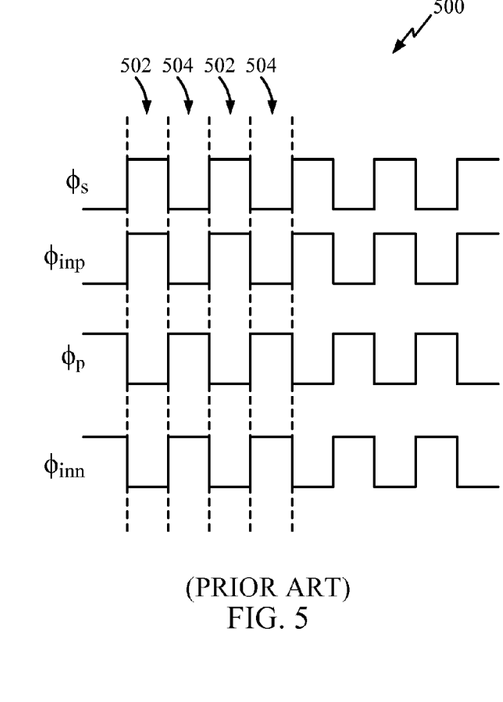

FIG. 4 is a circuit diagram of an example switched-capacitor integrator 400 having a conventional sampling network and clocking scheme. FIG. 5 is an example timing diagram 500 illustrating the switching relationship for switches $\Phi_{inp}$, $\Phi_{inn}$, $\Phi_s$, and $\Phi_p$, in the integrator 400 of FIG. 4. The sampling network in FIG. 4 comprises a plurality of switches $\Phi_{inp}$, $\Phi_{inn}$ coupled between a differential input (Input$^+$ and Input$^-$) and first and second sampling capacitors 404A and 404B (collectively, "sampling capacitors 404"). The sampling capacitors 404 are coupled with a set of switches $\Phi_s$ configured to connect one side of the capacitors 404 with a reference potential (e.g., a common-mode voltage ($V_{CM}$), such as a $V_{CM}$ of the differential input signal) during a sampling phase 502 of the integrator 400. In certain aspects, the reference potential may be any voltage between the supply voltage rails of an amplifier 412 for the integrator 400. A set of switches $\Phi_p$ are configured to couple the sampling capacitors 404 with a set of integration capacitors 410A and 410B (collectively "integration capacitors 410," also referred to as feedback capacitors ($C_{fb}$)) during an integration phase 504 of the integrator. The integration capacitors 410 are coupled between input and output terminals of the amplifier 412 in a feedback configuration, for example.

In operation, during the sampling phase 502, switches $\Phi_s$ and $\Phi_{inp}$ are closed (e.g., indicated by a logic high during the sampling phase 502 of the timing diagram 500) and the switches $\Phi_p$ and $\Phi_{inn}$ are open (e.g., indicated by a logic low in the timing diagram 500). Therefore, during the sampling phase 502, the sampling capacitor 404A is coupled between the positive input terminal (Input$^+$) and $V_{CM}$ (or any other suitable reference potential). Thus, charge is transferred from the positive input terminal, through one of the switches $\Phi_{inp}$, to the sampling capacitor 404A. Moreover, during the sampling phase 502, the sampling capacitor 404B is coupled between the negative input terminal (Input) and $V_{CM}$, and thus, charge is transferred from the negative input terminal to the sampling capacitor 404B via the other one of the switches $\Phi_{inp}$.

During the integration phase 504, switches $\Phi_s$ and $\Phi_{inp}$ are opened, and the switches $\Phi_p$ and $\Phi_{inn}$ are closed. Thus, one terminal of the sampling capacitor 404A is coupled to the negative input terminal (Input$^-$), and the other capacitor terminal is coupled to the amplifier's negative input terminal and the integration capacitor 410A. Moreover, one terminal of the sampling capacitor 404B is coupled to the positive input terminal (Input⁺), and the other capacitor terminal is coupled to the amplifier's positive input terminal and the integration capacitor 410B. Therefore, charge across the sampling capacitors 404A and 404B is transferred, through switches $\Phi_p$, to the integration capacitors 410A and 410B, respectively. In addition, the polarity of the differential input is flipped by opening switches $\Phi_{inp}$ and closing switches $\Phi_{inn}$ during the integration phase 504. That is, one terminal of the sampling capacitor 404A is coupled to the negative input terminal (Input⁻), and the other capacitor terminal is coupled to the amplifier's negative input terminal and the integration capacitor 410A. Likewise, one terminal of the sampling capacitor 404B is coupled to the positive input terminal (Input⁺), and the other capacitor terminal is coupled to the amplifier's positive input terminal and the integration capacitor 410B.

The equivalent input impedance ($R_{eq}$) of the sampling network of FIG. 4 operated in accordance with the clocking scheme depicted in the timing diagram 500 may be represented in accordance with the following equation:

$$R_{eq} = \frac{1}{4 f_{clk} C_S} \quad (1)$$

where $f_{clk}$ is the switching frequency of the input stage switches $\Phi_{inp}$, and $\Phi_{inn}$ and $C_s$ is the capacitance of the sampling capacitors 404.

As shown in equation (1), the equivalent input impedance ($R_{eq}$) is inversely proportional to the switching frequency ($f_{clk}$). A lower input impedance places greater strain on driving circuits and results in greater power consumption by the sampling network. Therefore, by reducing the switching frequency (e.g., increasing the equivalent input impedance) the power efficiency of the sampling network may be improved.

Moreover, with a passive anti-aliasing filter (AAF), which may be located in front of the sampling network, lower input impedance also increases the insertion loss (IL) and degrades the linearity. Therefore, by increasing the equivalent input impedance ($R_{eq}$), IL and linearity may also be improved. Therefore, aspects of the present disclosure provide a switched-capacitor integrator that may be operated at a lower input stage switching frequency (e.g., higher equivalent input impedance), as compared to the integrator 400, resulting in improved power consumption, IL, and linearity.

Figure 6:
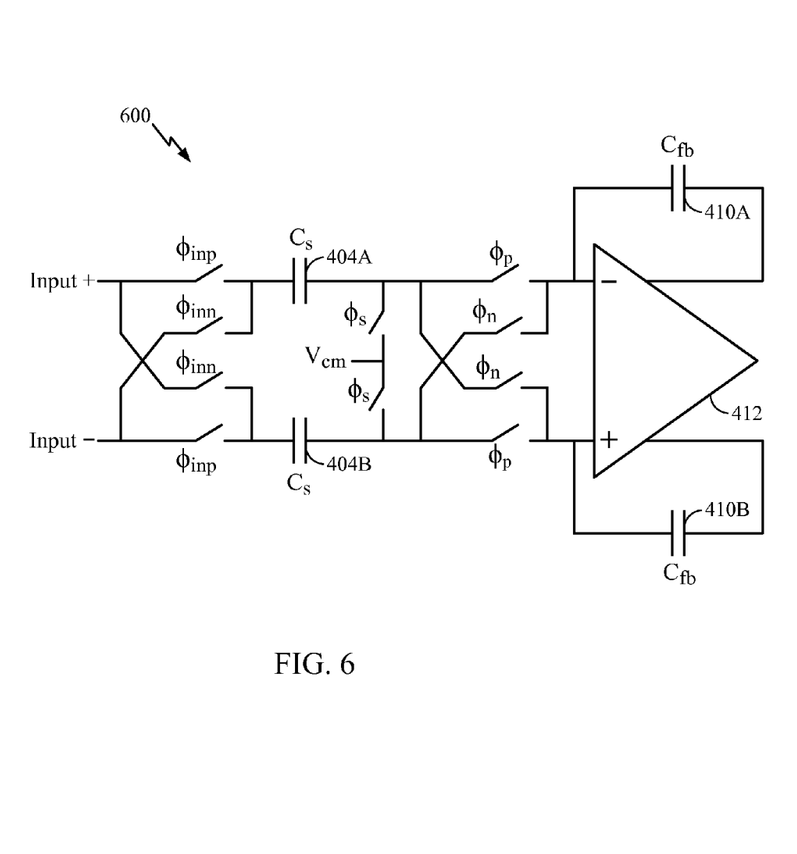
FIGS. 6 and 7 are circuit and timing diagrams for a switched-capacitor integrator having a higher input impedance as compared to the switched-capacitor integrator of FIGS. 4 and 5, in accordance with certain aspects of the present disclosure.
Figure 7:
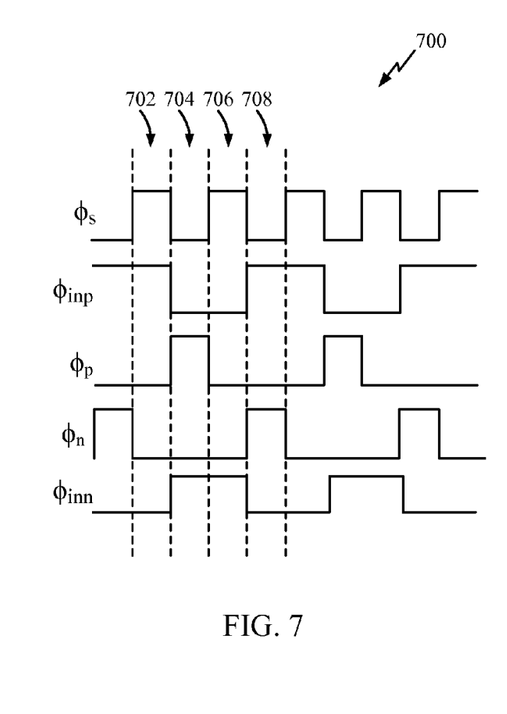

FIG. 6 is a circuit diagram of a switched-capacitor integrator 600 with a sampling network that may be operated at a reduced input stage switching frequency, in accordance with certain aspects of the present disclosure. FIG. 7 is an example timing diagram 700 illustrating the switching relationship of switches $\Phi_{inp}$, $\Phi_{inn}$, $\Phi_s$, $\Phi_n$, and $\Phi_p$ in sampling network associated with integrator 600, in accordance with certain aspects of the present disclosure.

Figure 8A:
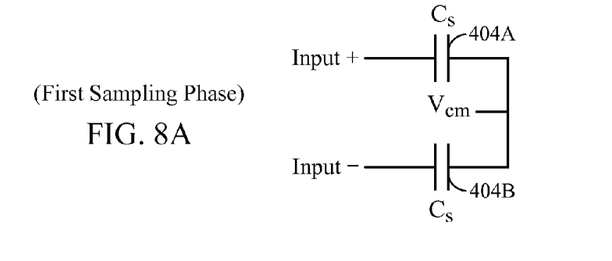
FIGS. 8A-D illustrate example equivalent circuit diagram configurations for the switched-capacitor integrator of FIG. 6 during a first sampling phase, a first integration phase, a second sampling phase, and a second integration phase, respectively, in accordance with certain aspects of the present disclosure.

During a first sampling phase 702, switches $\Phi_s$ and $\Phi_{inp}$ are closed; the other sets of switches in the sampling network may be open. Therefore, the sampling capacitor 404A is coupled between the positive input terminal and $V_{CM}$ (or any other suitable reference potential). An equivalent circuit diagram of the switched-capacitor integrator 600 during the first sampling phase 702 is illustrated in FIG. 8A. As illustrated, the sampling capacitor 404A is coupled between the positive input terminal (Input⁺) and $V_{CM}$, and thus, charge is transferred from the positive input terminal to the sampling capacitor 404A. Moreover, the sampling capacitor 404B is coupled between the negative input terminal (Input⁻) and $V_{CM}$, and thus, charge is transferred from the negative input terminal to the sampling capacitor 404B.

Figure 8B:
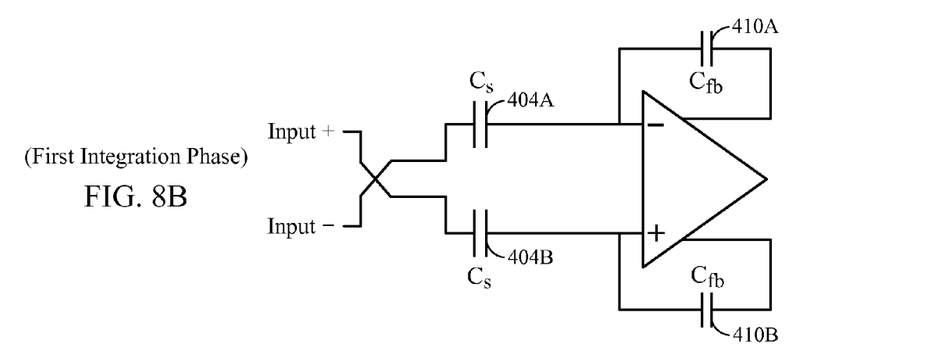

During a first integration phase 704 (following the first sampling phase 702), switches $\Phi_{inn}$ and $\Phi_p$ are closed, and the other sets of switches in the sampling network may be open. An equivalent circuit diagram of the switched-capacitor integrator 600 during the first integration phase 704 is illustrated in FIG. 8B. As illustrated, the sampling capacitor 404A is coupled to Input and to the amplifier's negative input terminal and the integration capacitor 410A, and thus, charge is transferred from the sampling capacitor 404A to the integration capacitor 410A. Moreover, the sampling capacitor 404B is coupled to Input⁺ and to the amplifier's positive input terminal and the integration capacitor 410B, and thus, charge is transferred from the sampling capacitor 404B to the integration capacitor 410B.

The first sampling and integration phases 702, 704 are similar to the sampling and integration phases 502, 504 described above with respect to FIGS. 4 and 5. However, certain aspects of the present disclosure provide a second sampling phase 706 and a second integration phase 708.

Figure 8C:
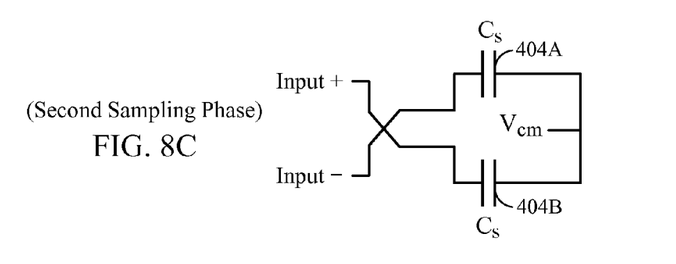

During the second sampling phase 706 (following the first integration phase 704), switches $\Phi_s$ and $\Phi_{inn}$ are closed, and the other sets of switches in the sampling network may be open. An equivalent circuit diagram of the switched-capacitor integrator 600 during the second sampling phase 706 is illustrated in FIG. 8C. As illustrated, the input stage of the second sampling phase 706 operates in reverse polarity as compared to the first sampling phase 702. That is, the sampling capacitor 404A is now coupled between Input⁻ and $V_{CM}$, and thus, charge is transferred from the negative input terminal to the sampling capacitor 404A. Moreover, the sampling capacitor 404B is now coupled between Input⁺ and $V_{CM}$, and thus, charge is transferred from the positive input terminal to the sampling capacitor 404B.

Figure 8D:
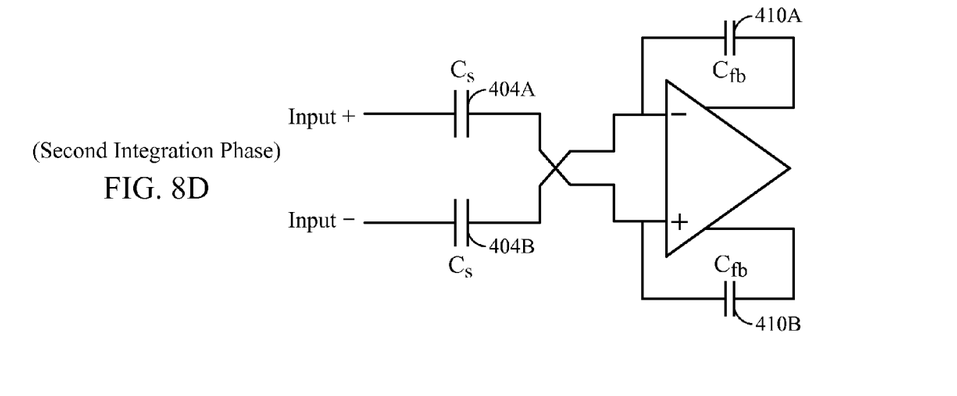

During the second integration phase 708 (following the second sampling phase 706), switches $\Phi_{inp}$ and $\Phi_n$ are closed, and the other sets of switches in the sampling network may be open. An equivalent circuit diagram of the switched-capacitor integrator 600 during the second integration phase 708 is illustrated in FIG. 8D. As illustrated, the sampling capacitor 404A is coupled to Input⁺ and to the amplifier's positive input terminal and the integration capacitor 410B, and thus, charge is transferred from the sampling capacitor 404A to the integration capacitor 410B. Moreover, the sampling capacitor 404B is coupled to Input and to the amplifier's negative input terminal and the integration capacitor 410A, and thus, charge is transferred from the sampling capacitor 404B to the integration capacitor 410A.

Therefore, as illustrated in the timing diagram 700 corresponding to the sampling network in FIG. 6, the input stage switches $\Phi_{inp}$ and $\Phi_{inn}$ (e.g., at the input side of the sampling capacitors 404) switch at half the clock rate as compared to the switches $\Phi_s$. As a result, the second sampling phase 706 operates in reverse polarity as compared to the first sampling phase 702 (e.g., the polarity of the input terminal is flipped as compared to the first sampling phase 702), as shown in the equivalent circuit diagrams of FIGS. 8A and 8C. Therefore, in an effort to compensate for the change in polarity during the second sampling phase 706 (e.g., caused by the half rate switching at the input stage), switches $\Phi_p$ and $\Phi_n$ are configured to flip the connection between the sampling capacitors 404A and 404B with the positive and negative input terminals of the amplifier 412, during the second integration phase 708. That is, switches $\Phi_p$ and $\Phi_n$ are configured to switch the polarity of the second terminals of the first and second sampling capacitors 404 at the full clock rate to flip the charge polarity during every other integration phase.

By operating the sampling network of integrator 600 in accordance with the timing diagram 700, the equivalent input impedance of the integrator 600 may be doubled as compared to that of the sampling network of integrator 400 in FIG. 4, as shown below with reference to Equation 2. This increased impedance can be used with the upfront anti-aliasing filter (AAF) to achieve a target insertion loss and may allow for the use of smaller capacitors to obtain a desired cutoff frequency. Moreover, because the input stage is switching at half the clocking rate, more settling time is provided for the upfront circuitry. Therefore, by using the sampling network in FIG. 6, settling and distortion performance may be improved.

The equivalent input impedance ($R_{eq}$) of the sampling network in FIG. 6 operated in accordance with the clocking scheme shown in the timing diagram 700 may be represented by the following equation:

$$R_{eq} = \frac{1}{2 f_{clk} C_S} \quad (2)$$

Based on Equation 2, the equivalent input impedance ($R_{eq}$) of the sampling network in the integrator 600 operated in accordance with the clocking scheme illustrated by the timing diagram 700 is doubled, as compared to Equation 1. Therefore, the driving power consumption for the sampling network in FIG. 6 may also be half of the driving power consumption of the sampling network in FIG. 4. For example, for a transmitter (TX) front end, the driving power may be reduced from 0.72 mW to 0.36 mW, and the DAC reference buffer driving power may be reduced from 1.2 mW to 0.6 mW. Moreover, the total power consumption may be reduced from 3 mW to 2.1 mW per channel, for example.

In an ADC, with a passive anti-aliasing filter (AAF) in front of the sampling network, operating the switched-capacitor integrator sampling network with the clocking scheme according to the timing diagram 700 also reduces the insertion loss and thus, increases the signal-to-noise ratio (SNR) of the system. Due to half the switching activity at the input side (e.g., switches $\Phi_{inp}$ and $\Phi_{inn}$ operated at half the frequency of switches $\Phi_s$), the linearity of the sampling network may also be improved. Moreover, the total harmonic distortion (THD) may also be reduced from −105 dB (typical case)/−97 dB (worst case) to −111 dB (typical case)/−102 dB (worst case).

Figure 9:
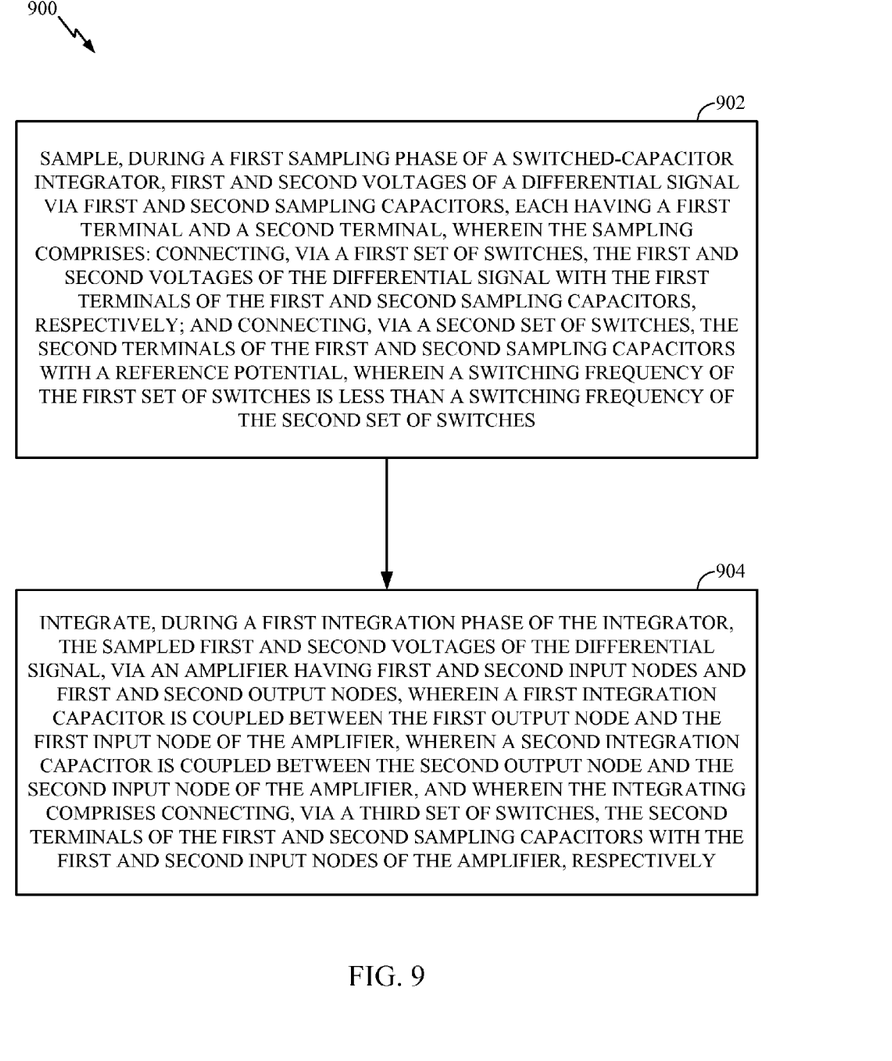
FIG. 9 is a flow diagram of example operations for processing a differential signal with a switched-capacitor integrator, in accordance with certain aspects of the present disclosure.

FIG. 9 illustrates a flow diagram of example operations 900 for processing a signal, in accordance with aspects of the present disclosure. The operations 900 may be performed, for example, by a circuit, such as the integrator 600 of FIG. 6.

The operations 900 begin, at 902, with the circuit sampling, during a first sampling phase (e.g., phase 702) of the circuit, first and second voltages of a differential signal via first and second sampling capacitors (e.g., sampling capacitors 404), each having a first terminal and a second terminal. In certain aspects, the sampling at 902 includes connecting, via a first set of switches (e.g., switches $\Phi_{inp}$), the first and second voltages of the differential signal with the first terminals of the first and second sampling capacitors, respectively; and connecting, via a second set of switches (e.g., switches $\Phi_s$), the second terminals of the first and second sampling capacitors with a reference potential (e.g., $V_{CM}$). In certain aspects, a switching frequency of the first set of switches is less than a switching frequency of the second set of switches.

At 904, the circuit may integrate, during a first integration phase (e.g., phase 704) of the circuit, the sampled first and second voltages of the differential signal, via an amplifier (e.g., amplifier 412) having first and second input nodes and first and second output nodes. In certain aspects, a first integration capacitor (e.g., capacitor 410A) may be coupled between the first output node and the first input node of the amplifier, and a second integration capacitor (e.g., capacitor 410B) may be coupled between the second output node and the second input node of the amplifier. In certain aspects, the integrating at 904 involves connecting, via a third set of switches (e.g., switches $\Phi_p$) the second terminals of the first and second sampling capacitors with the first and second input nodes of the amplifier, respectively.

In certain aspects, the switching frequency of the first set of switches is half the switching frequency of the second set of switches. In certain aspects, a switching frequency of the third set of switches is half the switching frequency of the second set of switches.

In certain aspects, the operations 900 may further include the circuit connecting, during the first integration phase of the circuit via a fourth set of switches (e.g., switches $\Phi_{inn}$), the first and second voltages of the differential signal with the first terminals of the second and first sampling capacitors, respectively. In certain aspects, a switching frequency of the fourth set of switches is half the switching frequency of the second set of switches. In certain aspects, the circuit may open the third set of switches and the fourth set of switches during the first sampling phase.

In certain aspects, during a second sampling phase (e.g., phase 706) of the circuit, the circuit may connect, via the fourth set of switches, the first and second voltages of the differential signal with the first terminals of the second and first sampling capacitors, respectively; and connect, via the second set of switches, the second terminals of the first and second sampling capacitors with the reference potential. In certain aspects, the circuit may open the first set of switches and the third set of switches during the second sampling phase. In certain aspects, during a second integration phase (e.g., phase 708) of the circuit, the circuit may connect, via the first set of switches, the first and second voltages of the differential signal with the first terminals of the first and second sampling capacitors, respectively; and connect, via a fifth set of switches (e.g., switches $\Phi_n$), the second terminals of the first and second sampling capacitors with the second and first input nodes of the amplifier, respectively. In certain aspects, a switching frequency of the fifth set of switches is half the switching frequency of the second set of switches.

In certain aspects, the circuit may open the second set of switches, the third set of switches, and the fourth set of switches during the second integration phase. In certain aspects, the circuit may open the first set of switches, the third set of switches, and the fifth set of switches during the second sampling phase. In certain aspects, the circuit may open the first set of switches, the second set of switches, and the fifth set of switches during the first integration phase. In certain aspects, the circuit may open the third set of switches, the fourth set of switches, and the fifth set of switches during the first sampling phase.

In certain aspects, the first integration phase follows the first sampling phase, the second sampling phase follows the first integration phase, and the second integration phase follows the second sampling phase. In certain aspects, the circuit may open the second set of switches during the first integration phase. In certain aspects, the circuit may open the third set of switches during the first sampling phase.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2. Means for sampling and means for integrating may include a circuit, such as various components in the switched-capacitor integrator 600 of FIG. 6. Means for connecting may include a switch or sets of switches, such as the switches in the integrator 600 of FIG. 6.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A switched-capacitor integrator, comprising:
    an amplifier having first and second output nodes and first and second input nodes;
    a first integration capacitor coupled between the first output node and the first input node of the amplifier;
    a second integration capacitor coupled between the second output node and the second input node of the amplifier;
    first and second sampling capacitors, each having a first terminal and a second terminal;

a first set of switches configured, during a first sampling phase of the integrator, to connect first and second voltages of a differential signal with the first terminals of the first and second sampling capacitors, respectively;

a second set of switches configured to connect the second terminals of the first and second sampling capacitors with a reference potential during the first sampling phase of the integrator, wherein a switching frequency of the first set of switches is less than a switching frequency of the second set of switches; and a third set of switches configured, during a first integration phase of the integrator, to connect the second terminals of the first and second sampling capacitors with the first and second input nodes of the amplifier, respectively.

2. The integrator of claim 1, wherein the switching frequency of the first set of switches is half the switching frequency of the second set of switches.

3. The integrator of claim 1, wherein a switching frequency of the third set of switches is half the switching frequency of the second set of switches.

4. The integrator of claim 1, further comprising a fourth set of switches configured, during the first integration phase of the integrator, to connect the first and second voltages of the differential signal with the first terminals of the second and first sampling capacitors, respectively.

5. The integrator of claim 4, wherein a switching frequency of the fourth set of switches is half the switching frequency of the second set of switches.

6. The integrator of claim 4, wherein the third set of switches and the fourth set of switches are open during the first sampling phase.

7. The integrator of claim 4, wherein during a second sampling phase of the integrator:
the fourth set of switches are configured to connect the first and second voltages of the differential signal with the first terminals of the second and first sampling capacitors, respectively; and
the second set of switches are configured to connect the second terminals of the first and second sampling capacitors with the reference potential.

8. The integrator of claim 7, wherein the first set of switches and the third set of switches are open during the second sampling phase.

9. The integrator of claim 7, further comprising a fifth set of switches, wherein during a second integration phase of the integrator:
the first set of switches are configured to connect the first and second voltages of the differential signal with the first terminals of the first and second sampling capacitors, respectively; and
the fifth set of switches are configured to connect the second terminals of the first and second sampling capacitors with the second and first input nodes of the amplifier, respectively.

10. The integrator of claim 9, wherein a switching frequency of the fifth set of switches is half the switching frequency of the second set of switches.

11. The integrator of claim 9, wherein the second set of switches, the third set of switches, and the fourth set of switches are open during the second integration phase.

12. The integrator of claim 9, wherein:
the first set of switches, the third set of switches, and the fifth set of switches are open during the second sampling phase;

the first set of switches, the second set of switches, and the fifth set of switches are open during the first integration phase; and
the third set of switches, the fourth set of switches, and the fifth set of switches are open during the first sampling phase.

13. The integrator of claim 9, wherein the first integration phase follows the first sampling phase, wherein the second sampling phase follows the first integration phase, and wherein the second integration phase follows the second sampling phase.

14. The integrator of claim 1, wherein the second set of switches are open during the first integration phase.

15. The integrator of claim 1, wherein the third set of switches are open during the first sampling phase.

16. A method for processing a differential signal with a switched-capacitor integrator, comprising:
during a first sampling phase of the integrator, sampling first and second voltages of a differential signal via first and second sampling capacitors, each having a first terminal and a second terminal, wherein the sampling comprises:
connecting, via a first set of switches, the first and second voltages of the differential signal with the first terminals of the first and second sampling capacitors, respectively; and
connecting, via a second set of switches, the second terminals of the first and second sampling capacitors with a reference potential, wherein a switching frequency of the first set of switches is less than a switching frequency of the second set of switches; and
during a first integration phase of the integrator, integrating the sampled first and second voltages of the differential signal, via an amplifier having first and second input nodes and first and second output nodes, wherein a first integration capacitor is coupled between the first output node and the first input node of the amplifier, wherein a second integration capacitor is coupled between the second output node and the second input node of the amplifier, and wherein the integrating comprises connecting, via a third set of switches, the second terminals of the first and second sampling capacitors with the first and second input nodes of the amplifier, respectively.

17. The method of claim 16, wherein the switching frequency of the first set of switches is half the switching frequency of the second set of switches.

18. The method of claim 16, wherein a switching frequency of the third set of switches is half the switching frequency of the second set of switches.

19. The method of claim 16, further comprising connecting, during the first integration phase of the integrator via a fourth set of switches, the first and second voltages of the differential signal with the first terminals of the second and first sampling capacitors, respectively.

20. The method of claim 19, wherein a switching frequency of the fourth set of switches is half the switching frequency of the second set of switches.

21. The method of claim 19, further comprising opening the third set of switches and the fourth set of switches during the first sampling phase.

22. The method of claim 19, further comprising, during a second sampling phase of the integrator:

connecting, via the fourth set of switches, the first and second voltages of the differential signal with the first terminals of the second and first sampling capacitors, respectively; and connecting, via the second set of switches, the second terminals of the first and second sampling capacitors with the reference potential.

23. The method of claim 22, further comprising opening the first set of switches and the third set of switches during the second sampling phase.

24. The method of claim 22, further comprising, during a second integration phase of the integrator:

connecting, via the first set of switches, the first and second voltages of the differential signal with the first terminals of the first and second sampling capacitors, respectively; and connecting, via a fifth set of switches, the second terminals of the first and second sampling capacitors with the second and first input nodes of the amplifier, respectively.

25. The method of claim 24, wherein a switching frequency of the fifth set of switches is half the switching frequency of the second set of switches.

26. The method of claim 24, further comprising opening the second set of switches, the third set of switches, and the fourth set of switches during the second integration phase.

27. The method of claim 24, further comprising:

opening the first set of switches, the third set of switches, and the fifth set of switches during the second sampling phase;

opening the first set of switches, the second set of switches, and the fifth set of switches during the first integration phase; and opening the third set of switches, the fourth set of switches, and the fifth set of switches during the first sampling phase.

28. The method of claim 24, wherein the first integration phase follows the first sampling phase, wherein the second sampling phase follows the first integration phase, and wherein the second integration phase follows the second sampling phase.

29. The method of claim 16, further comprising opening the second set of switches during the first integration phase.

30. The method of claim 16, further comprising opening the third set of switches during the first sampling phase.

* * * * *